United States Patent
Kaufmann et al.

(10) Patent No.: US 10,955,490 B2
(45) Date of Patent: Mar. 23, 2021

(54) TRANSFORMER TEST DEVICE AND METHOD FOR TESTING A TRANSFORMER

(71) Applicant: OMICRON ELECTRONICS GMBH, Klaus (AT)

(72) Inventors: Reinhard Kaufmann, Thüringerberg (AT); Boris Unterer, Feldkirch (AT); Markus Pütter, Sulz (AT)

(73) Assignee: OMICRON ELECTRONICS GMBH, Klaus (AT)

(*) Notice: Subject to any disclaimer, the term of this patent is extended or adjusted under 35 U.S.C. 154(b) by 229 days.

(21) Appl. No.: 15/522,323

(22) PCT Filed: Oct. 28, 2015

(86) PCT No.: PCT/EP2015/075018
§ 371 (c)(1),
(2) Date: Apr. 27, 2017

(87) PCT Pub. No.: WO2016/066701
PCT Pub. Date: May 6, 2016

(65) Prior Publication Data
US 2017/0336462 A1 Nov. 23, 2017

(30) Foreign Application Priority Data
Oct. 30, 2014 (AT) ............... A 50783/2014

(51) Int. Cl.
*G01R 31/62* (2020.01)
*G01R 31/72* (2020.01)
(Continued)

(52) U.S. Cl.
CPC ............ *G01R 31/62* (2020.01); *G01R 31/72* (2020.01); *H01H 9/54* (2013.01); *H01H 2009/0061* (2013.01)

(58) Field of Classification Search
CPC .... G01R 31/027; G01R 31/025; G01R 31/06; G01R 31/62; G01R 31/72; H01H 9/54
(Continued)

(56) References Cited

U.S. PATENT DOCUMENTS 4,177,419 A * 12/1979 Fiorentzis .......... G01R 31/3277
324/418
4,241,306 A * 12/1980 Bump .................... G01R 29/20
307/113
(Continued)

FOREIGN PATENT DOCUMENTS

| CN | 101527516 A | 9/2009 |
| CN | 103698621 A | 4/2014 |

(Continued)

OTHER PUBLICATIONS

VOTANO 100 Precise portable system for testing and calibrating voltage transformers, OMICRON L2255, Oct. 2013.
(Continued)

*Primary Examiner* — Jeff W Natalini
(74) *Attorney, Agent, or Firm* — Seyfarth Shaw LLP; Brian Michaelis (57) ABSTRACT

A transformer test device (10) for testing a transformer (40) has connections (12) for releasably connecting the transformer test device (10) to the transformer (40). The transformer test device (10) has a source (13) for generating a test signal for testing the transformer (40). The transformer test device (10) has a controllable switching means (15) which is connected to the connections (12) during a transformer test for the purpose of short-circuiting at least one winding (42) of the transformer (40).

7 Claims, 6 Drawing Sheets

(51) Int. Cl.
*H01H 9/54* (2006.01)
*H01H 9/00* (2006.01)

(58) Field of Classification Search
USPC .................................................. 324/547, 546
See application file for complete search history.

(56) References Cited

U.S. PATENT DOCUMENTS

| | | | | |
|---|---|---|---|---|
| 6,809,525 | B1* | 10/2004 | Sampat | G01R 31/027 |
| | | | | 324/546 |
| 2003/0123265 | A1* | 7/2003 | Uchida | H02M 1/32 |
| | | | | 363/21.12 |
| 2004/0124860 | A1* | 7/2004 | Hamdan | G01R 1/025 |
| | | | | 324/726 |
| 2005/0035767 | A1* | 2/2005 | Hardy | G01R 31/045 |
| | | | | 324/538 |
| 2012/0062249 | A1* | 3/2012 | Shamir | G01R 15/186 |
| | | | | 324/679 |
| 2014/0210495 | A1 | 7/2014 | Kondo | |
| 2017/0040991 | A1* | 2/2017 | D'Oyly-Watkins | H03K 17/18 |

FOREIGN PATENT DOCUMENTS

| | | | |
|---|---|---|---|
| GB | 2411733 | A | 9/2005 |
| KR | 20140009622 | A | 1/2014 |
| RU | 2447536 | C2 | 4/2012 |
| RU | 2506600 | C1 | 2/2014 |
| SU | 445001 | A1 | 9/1974 |
| SU | 1335904 | A1 | 9/1987 |

OTHER PUBLICATIONS

CT Analyzer, Revolution in Current Transformer Testing and Calibration, OMICRON L2065, Nov. 2012.
Diagnostic Testing Solutions for Power Transformers. May 30, 2013. pp. 1-32. https://www.omircorn.at/fileadmin/user_upload/pdf/literature/Transformer-brochure-ENU.pdf. Downloaded on Jun. 17, 2015.
CPC 100 Multi-functional Primary Test System for Substation Commissioning and Maintenance. Apr. 1, 2012. pp. 1-48. https://www.omicronenergy.com/fileadmin/user_upload/pdf/literature/CPC-100-Brochure-ENU.pdf. Downloaded Jan. 20, 2016.
International Search Report of PCT/EP2015/075018. dated Jan. 29, 2016.

* cited by examiner

TRANSFORMER TEST DEVICE AND METHOD FOR TESTING A TRANSFORMER

FIELD OF THE INVENTION

The invention relates to a transformer test device and to a method for testing transformers. The invention relates, in particular, to devices and methods of this kind in which a winding of the transformer is short-circuited at least during a portion of a transformer test.

BACKGROUND

Transformers are used as constituent parts of energy supply systems. Transformers can be used for voltage conversion from a first value on a high-voltage side to a second value, which is smaller than the first value, on a low-voltage side.

Determining properties of a transformer by a transformer test, in which one or more characteristic variables of the transformer are ascertained by measurement, is necessary, for example, for the purpose of ensuring operational reliability, for actuation and for other reasons. Examples of transformer tests of this kind include determining a static resistance, determining a dynamic resistance, determining a transformation ratio and/or determining a stray impedance or stray inductance. In the case of a static resistance measurement, a direct current can be fed into a winding of the transformer, and the voltage can be measured. In the case of a dynamic resistance measurement, the transformation ratio of the transformer can be switched over during the measurement using an on-load tap changer. A voltage, a current and/or a resistance can be recorded and evaluated. For example, conclusions can be drawn about a state of the on-load tap changer from the profile of the measured parameters.

A winding of the transformer, for example a winding on the low-voltage side, can be short-circuited during at least a portion of a transformer test. This conventionally requires rewiring in the sense of manual intervention with which electrically conductive connections have to be connected differently in order to execute a part of the transformer test in which a winding is short-circuited. This leads to additional work and time requirements. These rewiring operations can be very complicated, particularly in the case of transformers as are used in power plants or substations. Conductors or risers are often required.

SUMMARY OF THE INVENTION

There is a need for devices and methods with which a transformer test can be further automated. In particular, there is a need for devices and methods with which a transformer test can be further automated and the amount of work associated with rewiring can be reduced.

Exemplary embodiments specify a transformer test device and a method for testing a transformer, in which transformer test device and method the transformer test device is designed in order to short-circuit at least one winding of the transformer. The transformer test device can comprise a controllable switching device or switching means which is operated in order to allow a short-circuit current to flow from the transformer through the controllable switching means of the transformer test device.

In the case of the transformer test device and the method according to exemplary embodiments, the at least one winding can be short-circuited during a portion of a transformer test. The at least one winding can be short-circuited during the entire transformer test. The controllable switching means can be automatically actuated during execution of the transformer test such that a short-circuit current is allowed to flow through the transformer test device in a time-dependent manner. During execution of the transformer test, the controllable switching means can be automatically actuated such that a short-circuit current is allowed to flow through the transformer test in a time-dependent manner and is then suppressed again in order to perform different measurements.

The transformer test device can have connections which are to be connected to a low-voltage side of the transformer. The transformer test device can be designed such that the controllable switching means reduces the resistance between at least two of the connections which are to be connected to the low-voltage side, in order to short-circuit the at least one winding on the low-voltage side of the transformer. The transformer test device can be designed in order to short-circuit, as an alternative or in addition to the low-voltage side, the high-voltage side or a tertiary winding of the transformer using the controllable switching means. The transformer test device can be designed in order to short-circuit combinations of two windings. For example, the transformer test device can be designed in order to automatically short-circuit two of three windings of a transformer.

Here, short-circuiting is understood to mean establishing an electrically conductive path with a low resistance. The electrically conductive path can establish a virtually perfect electrical connection close to the winding of the transformer. A current measurement device, for example an ammeter, can also be looped into the path by means of connecting lines. Owing to line resistances and the internal resistance of the ammeter, the short circuit is not perfect, but can be clearly distinguished from no-load operation or no-load operation with a voltmeter connected.

The transformer test device can be designed in order to automatically temporarily apply the short circuit and temporarily open the short circuit during a test sequence. Therefore, for example, a source for a test signal can apply an AC voltage to the primary winding of the transformer and, when the short circuit is generated on the secondary side, measure a short-circuit impedance. When the short circuit is interrupted, the transformation ratio of the transformer can be determined by measuring the voltage on the primary and secondary side.

The short circuit can be established by the transformer test device on the low-voltage side or secondary side of the transformer.

Transformer test devices and methods according to exemplary embodiments allow measurements in which at least one winding is short-circuited during at least a portion of the transformer test to be carried out, without the connections between the transformer and the transformer test device having to be specifically changed for this purpose. The amount of work associated with rewiring operations can be reduced or eliminated.

A transformer test device for testing a transformer according to one exemplary embodiment comprises connections for releasably connecting the transformer test device to the transformer. The transformer test device comprises a source for generating a test signal for testing the transformer. The transformer test device comprises a controllable switching means which is connected to the connections during a transformer test for the purpose of short-circuiting at least one winding of the transformer.

The transformer test device can comprise a control device which is connected to the controllable switching means. The control device can be designed in order to automatically operate the controllable switching means at least once for the purpose of carrying out the transformer test. The control device can comprise one or more integrated semiconductor circuits.

The control device can be designed in order to automatically actuate the controllable switching means in a time-dependent manner in accordance with a time schedule which depends on a selected test procedure.

The transformer test device can comprise a user interface for selecting the test procedure from amongst a plurality of test procedures.

The control device can be designed in order to actuate the controllable switching means and the source in a time-dependent manner in accordance with the time schedule.

The transformer test device can be configured as a mobile transformer test apparatus.

The transformer test device can be configured as a portable transformer test apparatus.

The transformer test device can comprise a housing in which the source and the controllable switching means are accommodated. The connections can be provided on the housing.

The controllable switching means can be arranged in the interior of the housing.

The controllable switching means can be designed for the purpose of conducting a short-circuit current during the transformer test.

The transformer test device can comprise a current measurement device, for example an ammeter which is connected in series with the controllable switching means.

The transformer test device can be designed in order to short-circuit the at least one winding during a portion of a time period of the transformer test. The short circuit can be established and canceled in a time-dependent manner during the transformer test.

The transformer test device can be designed in order to short-circuit the at least one winding during an entire time period of the transformer test.

The transformer test device can be designed in order to perform at least one resistance measurement during the transformer test. As an alternative or in addition, the transformer test device can be designed in order to perform at least a stray impedance measurement during the transformer test. As an alternative or in addition, the transformer test device can be designed in order to perform at least one dynamic resistance measurement in the event of operation of an on-load tap changer during the transformer test.

The transformer test device can comprise a measurement device in order to record a test response of the transformer to the test signal. The measurement device can comprise a voltmeter and/or an ammeter. The transformer test device can have a processor or another electronic processing device which is designed in order to further process a test response which is recorded by the measurement device during the transformer test.

The test signal can be a current which is impressed into the transformer. The test response which is recorded using the measurement device can be a voltage which is recorded in a four-point measurement.

The test signal can be a voltage which is applied to the transformer. The test response which is recorded using the measurement device can be a voltage.

The transformer test device can be designed, for a static resistance measurement, in order to not short-circuit the at least one winding until a core of the transformer has entered saturation. The transformer test device can be designed to then short-circuit the at least one winding, in order to perform the resistance measurement, by operation of the controllable switch.

The transformer test device can be designed in order to measure a winding resistance of the transformer.

The transformer test device can be designed to perform a measurement at the transformer in the event of operation of an on-load tap changer of the transformer. The measurement can be a dynamic resistance measurement during a switching process of the on-load tap changer. In this case, the transformer test device can record a variation in current, voltage and/or resistance during switching of the on-load tap changer. The transformer test device can advantageously be designed in order to short-circuit the transformer at a different winding to the on-load tap changer winding, in order to amplify the variations in the electrical variables.

The source of the transformer test device can be configured such that it can be selectively operated as a current source or as a voltage source.

The source can comprise a current measurement device. The source can be designed in order to use an output signal from the current measurement device in a control loop for controlling current. As an alternative or in addition, a current measurement device can be connected in series with the source.

The controllable switching means can be a relay or can comprise a relay. The controllable switching means can be a bipolar transistor with an insulated gate electrode (IGBT) or a field-effect transistor (FET) or can comprise an IGBT or a FET.

A system according to one exemplary embodiment comprises a transformer and a transformer test device according to one exemplary embodiment, which transformer test device is releasably connected to the transformer by means of the connections.

The transformer test device can be connected to the transformer such that at least one winding on the low-voltage side or secondary side of the transformer can be short-circuited by means of the controllable switch of the transformer test device.

A further exemplary embodiment specifies a method for testing a transformer using a transformer test device. The transformer test device has connections for releasably connecting the transformer test device to the transformer. The method comprises short-circuiting at least one winding of the transformer using a controllable switching means of the transformer test device.

The method can be performed by the transformer test device according to one exemplary embodiment. The method can be automatically executed by the transformer test device according to one exemplary embodiment.

In the method, a control device, which is connected to the controllable switching means, can automatically operate the controllable switching means at least once for the purpose of carrying out the transformer test.

In the method, the controllable switching means can be automatically actuated in a time-dependent manner in accordance with a time schedule which depends on a selected test procedure.

The method can comprise recording a user input at a user interface, with which user input the test procedure is selected from amongst a plurality of test procedures.

In the method, the controllable switching means and the source can be actuated in a time-dependent manner in accordance with the time schedule.

The method can be performed by a transformer test device which is configured as a mobile transformer test apparatus.

The method can be executed by a transformer test device which is configured as a portable transformer test apparatus.

The controllable switching means, which is switched during the method, can be arranged in an interior of a housing of the transformer test device. The source can also be arranged in the housing.

In the method, the controllable switching means can conduct a short-circuit current during the transformer test.

In the method, the at least one winding can be short-circuited during a portion of a time period of the transformer test. The short circuit can be established and canceled in a time-dependent manner during the transformer test.

In the method, the at least one winding can be short-circuited during an entire time period of the transformer test.

The method can comprise at least one resistance measurement. As an alternative or in addition, the method can comprise at least one stray impedance measurement. As an alternative or in addition, the method can comprise at least one dynamic resistance measurement. As an alternative or in addition, the method can comprise a measurement of a transformation ratio.

In the method, a test response of the transformer to the test signal can be recorded using a measurement device. The measurement device can comprise a voltmeter and/or an ammeter. The test response which is recorded by the measurement device during the transformer test can be automatically processed further.

The test signal can be a current which is impressed into the transformer. The test response which is recorded using the measurement device can be a voltage which is recorded in a four-point measurement.

The test signal can be a voltage which is applied to the transformer. The test response which is recorded using the measurement device can be a current.

A winding resistance of the transformer can be measured in the method.

In the method, a measurement can take place at the transformer in the event of operation of an on-load tap changer of the transformer. The measurement can be a dynamic resistance measurement during a switching process of the on-load tap changer. In this case, a variation in current, voltage and/or resistance can be recorded during switching of the on-load tap changer. The transformer can advantageously be short-circuited at a different winding to the on-load tap changer winding, in order to amplify the variations in the electrical variables.

The controllable switching means can be a relay or can comprise a relay. The controllable switching means can be a bipolar transistor with an insulated gate electrode (IGBT) or a field-effect transistor (FET) or can comprise an IGBT or a FET.

In transformer test devices, systems and methods according to exemplary embodiments, a short circuit can be established at least during a portion of the transformer test, without rewiring having to be performed for this purpose.

Various measurement techniques can be used. For example, measurement of the short-circuit impedance of the transformer can be carried out particularly well with a current impressed on the primary side of the transformer and a short-circuited secondary winding. The transformation ratio can be particularly advantageously measured with an applied voltage on the primary side and a removed short circuit on the secondary side.

Transformer test devices, methods and systems according to exemplary embodiments allow further automation of transformer tests.

BRIEF DESCRIPTION OF THE FIGURES

The invention will be explained in more detail below with reference to the drawings using preferred embodiments. In the drawings, identical reference symbols identify identical elements.

DETAILED DESCRIPTION OF EXEMPLARY EMBODIMENTS

The present invention will be explained in more detail below on the basis of preferred embodiments with reference to the drawings. In the figures, identical reference symbols identify identical or similar elements. The figures are schematic illustrations of various embodiments of the invention. Elements illustrated in the figures are not necessarily illustrated true to scale. Rather, the various elements illustrated in the figures are reproduced in such a way that their function and their purpose are clear to a person skilled in the art.

Connections and couplings illustrated in the figures between functional units and elements can also be implemented as an indirect connection or coupling. A connection or coupling can be implemented using wires or without wires.

Devices and methods for carrying out a transformer test using a transformer test device will be described in detail below. The transformer can be a transformer for high- or medium-voltage networks. The transformer can be a transformer which is installed in a power plant or substation. The transformer test device can be a mobile apparatus which allows the transformer test to be carried out on the installed transformer.

The transformer test device is designed in order to be connected to a first winding and a second winding of the transformer, which second winding is DC-isolated from said first winding. The first winding can be a primary winding. The second winding can be a secondary winding. The primary winding can be a winding on a high-voltage side and the secondary winding can be a winding on a low-voltage side of the transformer. The second winding can be a tertiary winding of the transformer.

The transformer test device can comprise first connections with which the transformer test device can be connected to the first winding of the transformer by means of four electrically conductive connections. This allows, for example, impedance measurements to be carried out with a four-point measurement geometry in which a current is impressed and a voltage drop is recorded. The transformer test device can comprise second connections with which the transformer test device can be connected to the second winding of the transformer by means of four further electrically conductive connections.

As will be described in greater detail below, the transformer test device is designed in order to short-circuit at least one of the windings of the transformer. The transformer test device comprises a controllable switching means with which an electrically conductive connection can be selectively established for the purpose of short-circuiting the at least one winding. The controllable switching means can be a relay or another switch which is designed for the purpose of switching a load circuit under the control of a control circuit. The controllable switching means can be a bipolar transistor with an insulated gate electrode (IGBT) or a field-effect transistor (FET) or can comprise an IGBT or a FET.

A short-circuit current can flow from the at least one winding of the transformer through the transformer test device through the controllable switching means.

The transformer test device can be designed such that an impedance of an electrically conductive path in the transformer test device, which electrically conductive path connects two of the connections of the transformer test device by means of the controllable switching means, is smaller than an impedance of the at least one winding which can be short-circuited by the transformer test device when the controllable switching means is operated for the purpose of short-circuiting the at least one winding. The corresponding ratio of the impedances can apply at least for the frequency of the test signal which is generated by the transformer test device and which is generated by a source of the transformer test device while the transformer test device short-circuits the at least one winding.

The transformer test device can be designed such that an impedance of an electrically conductive path from the at least one winding by means of the transformer test device is smaller than an impedance of the at least one winding which can be short-circuited by the transformer test device.

The impedance of the conductive path in the transformer test device, which conductive path connects two of the connections of the transformer test device by means of the controllable switching means, should not be equal to zero. For example, an ammeter or another measurement device can be arranged in the electrically conductive path.

The controllable switching means can be automatically actuated in order to selectively control, for different time intervals of a transformer test, whether the at least one winding of the transformer should be short-circuited.

For example, the transformer test device can be designed in order to operate the controllable switching means in order to measure a short-circuit impedance.

As an alternative or in addition, the transformer test device can be designed in order to determine a transformation ratio of the transformer while the controllable switching means does not generate a short circuit.

As an alternative or in addition, the transformer test device can be designed in order to operate the controllable switching means in a time-dependent manner such that the at least one winding is not short-circuited while an iron core of the transformer is brought to saturation by impressing a current on the primary winding, and that the controllable switching means is operated as soon as the iron core is saturated. A measurement, for example a measurement of a short-circuit impedance, a stray impedance or a stray inductance, can then be carried out.

As an alternative or in addition, the transformer test device can be designed in order to operate the controllable switching means in a time-dependent manner such that the secondary winding of the transformer is short-circuited during switching of an on-load tap changer of the transformer.

Figure 1:
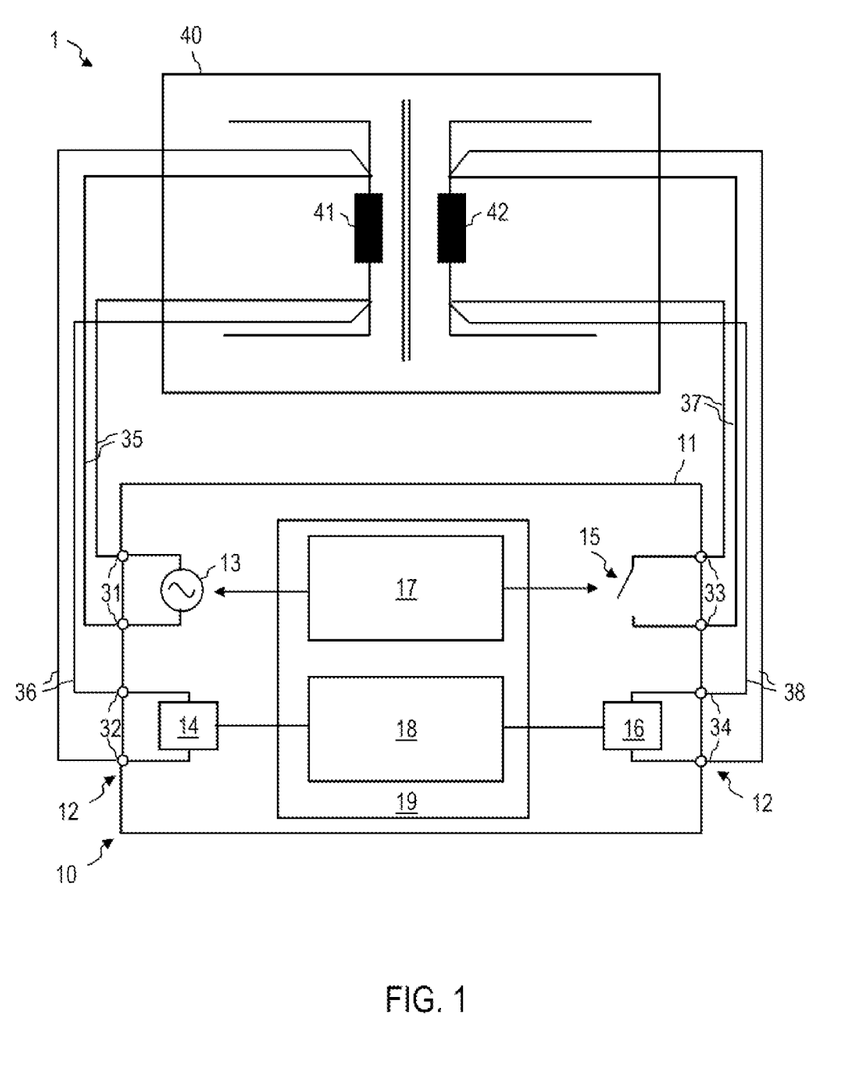
FIG. 1 shows a system comprising a transformer test device according to one exemplary embodiment.

FIG. 1 shows a system 1 comprising a transformer test device 10 according to one exemplary embodiment.

The system 1 comprises a transformer 40 and the transformer test device 10. The transformer test device 10 can be designed as a single apparatus comprising a housing 11. The transformer test device 10 can comprise an arrangement of a plurality of apparatuses or devices. In this case, the plurality of apparatuses or devices can be controlled by a central controller. The transformer test device 10 can be designed as a mobile apparatus and, in particular, as a portable apparatus. If the transformer test device 10 comprises a plurality of apparatuses, each of the apparatuses can be designed as a portable apparatus.

The transformer 40 can be a power transformer of an electrical energy supply device. The transformer 40 can be permanently installed in a power plant or substation while a transformer test is executed using the transformer test device 10. The transformer 40 can be a voltage converter or current converter. The transformer 40 can be a voltage converter or current converter which operates in accordance with an inductive operating principle.

The transformer 40 comprises at least a first winding 41 and a second winding 42. It is not important whether the first winding 41 is the primary winding and the second winding 42 is the secondary winding or vice versa. Similarly, it is not important whether the first winding 41 is the high-voltage winding and the second winding 42 is the low-voltage winding or vice versa.

The transformer test device 10 comprises a plurality of connections 12, a source 13 for a test signal which is applied to or impressed on the transformer 40 as a unit under test during the transformer test, and a controllable switching means 15. The controllable switching means 15 can be, for example, a relay, an IGBT or a FET.

The source 13 can be a current source which is controllable in order to generate a direct current and/or an alternating current as test signal. The source 13 can be controllable in order to generate alternating currents with several different frequencies as test signal. The source 13 can be a voltage source which is controllable in order to generate a DC voltage and/or an AC voltage as test signal. The source 13 can be controllable in order to generate AC voltages with several different frequencies as test signal. The source 13 can be operable in different operating modes, for example as a current source or as a voltage source and/or as a source of a temporally constant signal or an alternating signal. The source 13 can comprise a current measurement device. The source 13 can be designed in order to use an output signal from the current measurement device in a control loop for controlling current. As an alternative or in addition, a current measurement device can be connected in series with the source 13.

The transformer test device 10 can comprise further devices, for example one or more measurement devices 14, 16 for recording a test response in reaction to the test signal. The transformer test device 10 can comprise a control device 17 for automatically electrically controlling the controllable switching means 15. The transformer test device 10 can comprise an evaluation device 18 for evaluating a test response of the transformer 40 which is detected using the measurement devices 14, 16. The first measurement device 14 and the second measurement device 16 can each be designed, for example, for a voltage measurement. The first measurement device 14 and the second measurement device 16 can each be designed for the purpose of recording other electrical characteristic variables. The functions of the control device 17 and/or the evaluation device 18 can be performed by a processor 19 or another integrated semiconductor circuit 19.

The source 13 can generate a temporally variable test signal. A frequency of the test signal can be variable between several values. The first measurement device 14 and the second measurement device 16 can be designed to record a test response in a time-resolved manner. Measurement values which are recorded by the first measurement device 14 and the second measurement device 16 can be ND-converted and further evaluated mathematically, for example in order to determine characteristic variables of the transformer for each of several frequencies.

The connections 12 comprise output connections 31 which are coupled to the source 13. The output connections 31 are electrically conductively connected to the first winding 41 of the transformer 40 by means of one or more lines 35.

The connections 12 comprise input connections 32, 34 which are connected to one or more windings of the transformer by means of one or more lines 36, 38 in order to record a test response of the transformer 10. A measurement device 14 can be connected to the first winding 41, for example, by means of further lines 37 which are separate from the lines 35. The measurement device 14 can be a voltmeter. A connection of this kind between the transformer test device 10 and the transformer 40 allows, for example, measurement in accordance with a so-called four-wire method. Separately guiding voltage lines from the input connection 32 to the first winding 41 can result in a voltage drop of the line 31 between the output connection 31 and the first winding 41 not corrupting the measurement result.

The transformer test device 10 comprises at least one pair of connections 33 which can be short-circuited by means of the controllable switching means 15. The controllable switching means can be a conventional switch, a mechanical-electrical switch, a relay, a FET, an IGBT or another component which is suitable for establishing an electrically conductive connection between the connections 33 depending on a state of the switching means. The conductive path in the transformer test device 10 between the connections 33 has an impedance which, at at least one frequency or all frequencies with which the test signal is generated by the source 13, is smaller than an impedance of the winding 42 to which the pair of connections 33 is connected by means of lines 37.

The second winding 42 can also be connected to the connections 12 of the transformer test device 10 by means of at least four lines 37, 38. The input connections 34 can comprise a voltage input 34 which can be connected to a further voltmeter in order to connect said voltmeter to the second winding 42 of the transformer 40. Separately guiding the lines 37 and 38 can prevent corruption of measurement results by any voltage drop on the line 37 between the pair of connections 33 and the second winding 42.

The transformer 40 can also comprise more than two windings 41, 42. The transformer test device 10 can comprise connections for connection to a third winding of the transformer 40 and any further windings of the transformer 40. The transformer test device 10 can comprise connections for connection to any winding of the transformer 40 for a four-wire measurement. The transformer test device 10 can also comprise at least one second controllable switch 15 in order to short-circuit the first winding 41 or further windings of the transformer 40 when said windings are connected to the transformer test device 10.

The transformer test device 10 can be designed in order to short-circuit combinations of two windings. For example, two of three windings of a transformer can be short-circuited at the same time or sequentially in time. Test procedures can also be run automatically, in the case of which only one of a plurality of windings of the transformer is initially short-circuited and then two or more than two windings are short-circuited at the same time or sequentially in time. In this case, short-circuiting can be performed automatically in each case by a controllable switching means of the transformer test device 10.

The transformer test device 10 is designed such that different measurements can take place, without the connections 35-38 between the transformer test device 10 and the transformer 40 having to be released and/or connected in some other way. The different measurements can be performed without the unit under test having to be rewired. The measurements can be carried out in a fully or partially automated manner by the transformer test device 10, that is to say without interaction of the user between the measurements.

At least one of the windings of the transformer 40 can be short-circuited by the controllable switching means 15 for at least a portion of the measurement.

For example, the transformer test device 10 can perform a transformation measurement. The source 13 can be operated as an AC voltage source for this purpose. The switch 15 can be opened. A voltage at the first winding 41 can be recorded using the first measurement device 14. A voltage at the second winding 42 can be recorded using the second measurement device 16. The transformation ratio can be determined by the transformer test device 10 from a ratio of the voltages.

As an alternative or in addition, the transformer test device 10 can be designed in order to perform a short-circuit impedance measurement. The source 13 can be operated as an alternating current source for this purpose. The switch 15 can be closed. This can be done by a control signal of the control device 17. The voltage at the first winding 41 can be recorded using the first measurement device 14. A current in the second winding 42 can optionally be recorded by an ammeter (not illustrated in FIG. 1). The recorded current in the second winding 42 can be used by the evaluation device 18 for correction purposes. For example, a fault which is produced by a resistance of the lines 37, 38 from the second winding 42 to the test device 10 can be at least partially corrected.

As an alternative or in addition, the transformer test device 10 can be designed in order to perform a winding resistance measurement. The resistance measurement can be a static resistance measurement. The winding resistance of the first winding 41 can be determined. The source 13 can operate as a direct current source for the purpose of determining the winding resistance. The voltage at the first winding 41 can be measured by the first measurement device 14. The direct current can be impressed until an iron core of the transformer 40 enters saturation. In this time interval of the measurement, the controllable switching means 15 can be opened in order to more quickly reach the state in which the iron core is saturated. The controllable switching means 15 can be controlled such that it is closed in order to short-circuit the second winding 42 when, after saturation of the transformer core, a winding resistance measurement, a short-circuit impedance measurement, a stray impedance measurement or other measurements are performed. A voltage at the second winding 42 can respectively also be measured using the second measurement device 16 and used for the purpose of correcting faults, for example on account of line resistances.

As an alternative or in addition, the transformer test device 10 can be designed in order to detect a behavior of the transformer 30 at the moment at which the transformation ratio is switched over. A measurement of this kind is also called dynamic resistance measurement. For the purpose of measuring the dynamic resistance ratio, the controllable switch 15 can be respectively closed at least when the switchover process of the transformation ratio takes place. As a result, the effects which are recorded at the first winding 14 and which are caused by the switchover process can be amplified.

Several of said measurements or further measurements which differ therefrom can be performed by the transformer test device 10, without the connections between the transformer test device 10 and the transformer 40 having to be varied by user intervention for this purpose. In particular, the several measurements can be performed without the connection points of the connections 35-38 at the transformer 40 and at the connections 12 of the transformer test device 10 having to be changed.

The control device 17 can be designed in order to electrically actuate the controllable switching means 15. The control device 17 can switch the controllable switching means 15 to a closed state during a portion of a transformer test or during the entire transformer test in order to short-circuit the second winding 42.

The transformer test device 10 can be designed in order to sequentially perform several different measurements, wherein the measurements and optionally the order of said measurements can be established in a user-defined manner. The transformer test device 10 can comprise a graphical user interface with which it is possible to establish, in a user-defined manner, which measurements are performed. Depending on a user input which determines the measurements to be performed, the controllable switching means 15 and the source 13 can be controlled in a time-dependent manner such that the selected measurements are performed. It is also possible for only one single measurement, for example a measurement of the transformation ratio or a winding resistance measurement or a stray impedance measurement, to be selected. The transformer test device 10 then switches the controllable switching means 15 in accordance with the selected measurement.

Figure 2:
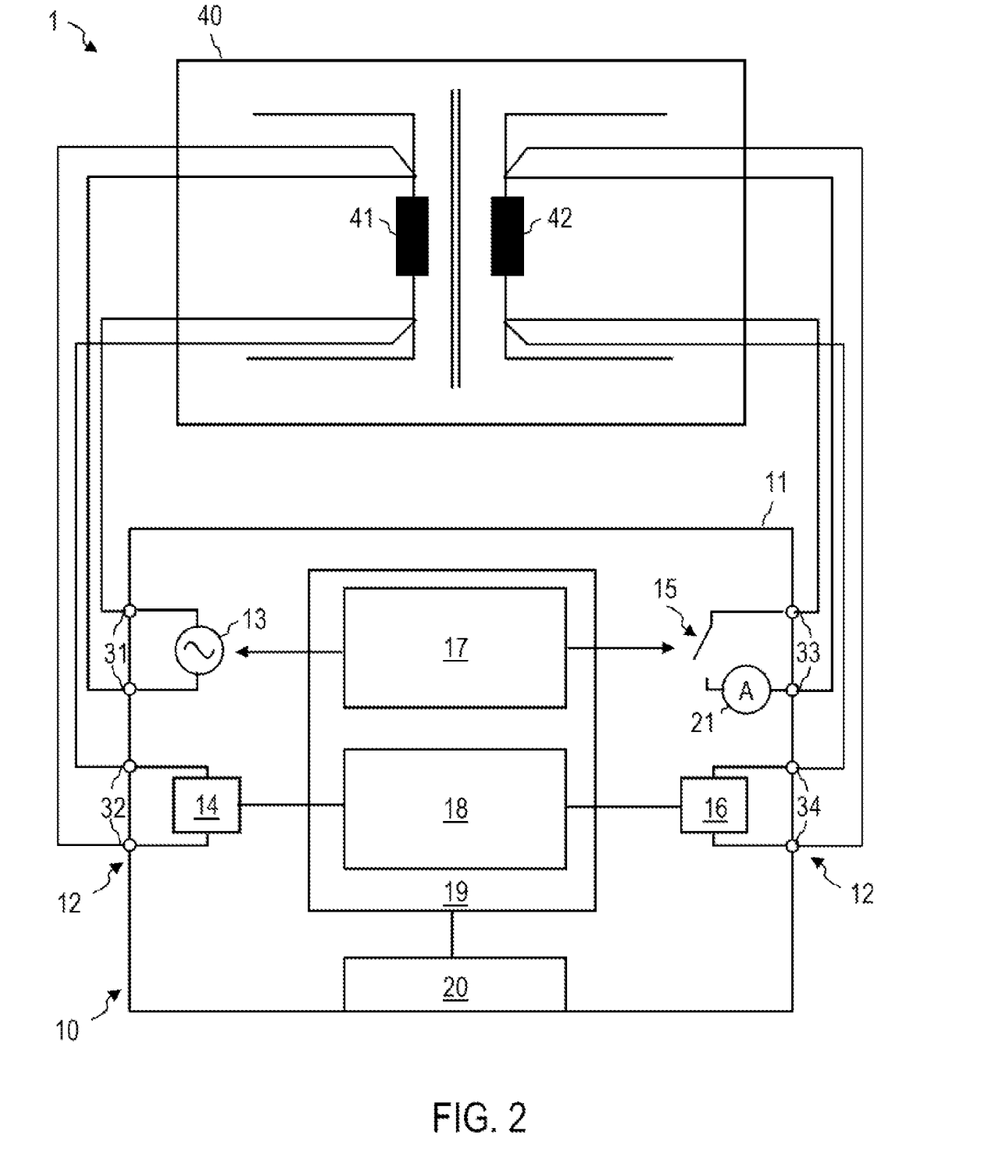
FIG. 2 shows a system comprising a transformer test device according to one exemplary embodiment.

FIG. 2 is an illustration of a system 1 comprising a transformer test device 10 according to a further exemplary embodiment. The transformer test device 10 comprises a graphical user interface 20. The graphical user interface 20 can be designed in order to allow measurements which are performed using the transformer test device 10 to be established in a user-defined manner. The controllable switching means 15 can be switched once or several times during the transformer test. The controllable switching means 15 can be automatically switched under the control of the control device 17, without a user input or another user action being required for this once the transformer test has started.

The transformer test device 10 illustrated in FIG. 2 also has an ammeter 21 which is connected in series with the controllable switching means 15. The ammeter 21 can have an internal resistance which is much smaller than an impedance of the second winding 42 to which the connections 33 are connected. An output signal from the ammeter 21 can be evaluated by the evaluation device 18, for example in order to perform correction of the voltages which are recorded using the measurement devices 14, 16.

Figure 3:
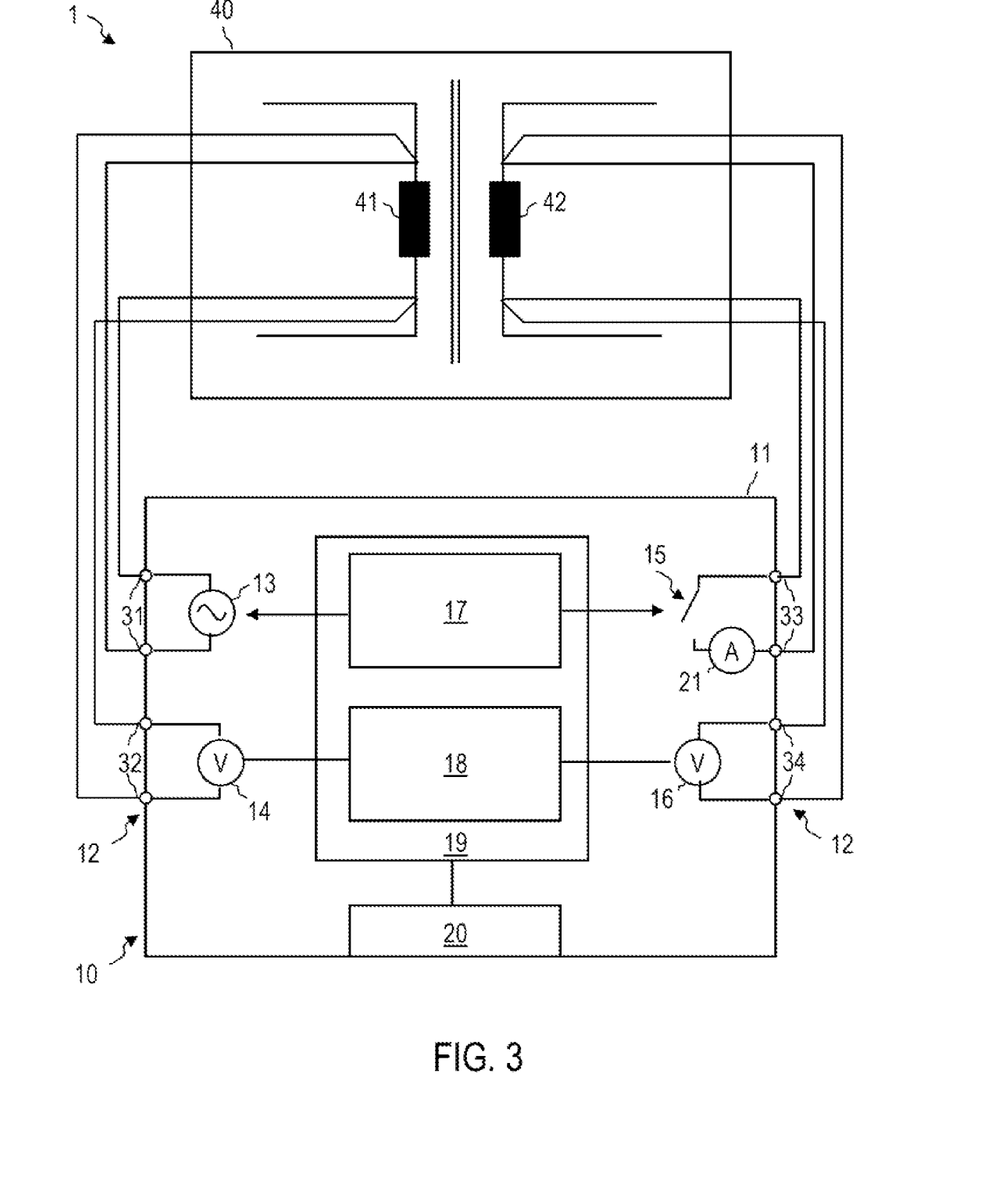
FIG. 3 shows a system comprising a transformer test device according to one exemplary embodiment.

FIG. 3 is an illustration of a system 1 comprising a transformer test device 10 according to a further exemplary embodiment. In the transformer test device 10, the measurement devices 14, 16 are configured as voltmeters in order to record a voltage which is dropped across the first winding 41 and the second winding 42. Other configurations of the measurement devices 14, 16 can be used.

Figure 4:
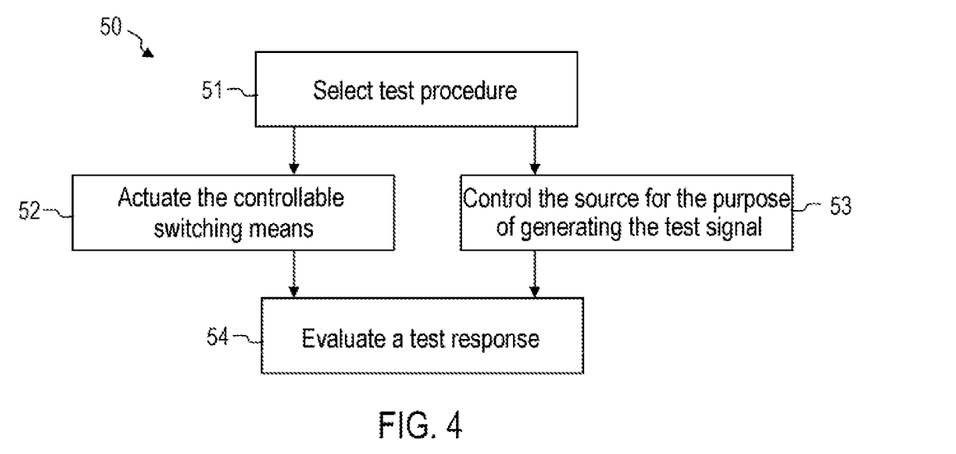
FIG. 4 is a flowchart of a method according to one exemplary embodiment.

FIG. 4 is a flowchart of a method 50 according to one exemplary embodiment. The method 50 can be automatically executed by the transformer test device 10 according to one exemplary embodiment.

A test procedure can be selected at step 51. The test procedure can comprise one or more measurements which are performed at the transformer 40. The test procedure can be selected in a user-defined manner from amongst a plurality of test procedures.

The controllable switching means 15 is controlled depending on the selected test procedure in step 52. The controllable switching means 15 can be automatically controlled such that a winding of the transformer 40 is short-circuited during the entire test procedure or during a portion of the test procedure. A short-circuit current of the winding flows across the transformer test device 10.

The source for the purpose of generating the test signal is controlled in step 53. The source can be controlled such that it selectively generates a direct current, a DC voltage or an AC voltage. Different test signals can also be generated in a time-dependent manner.

The actuation of the source and the actuation of the controllable switch can be coordinated with one another in respect of time. For example, in a portion of a test procedure in which a transformer core is intended to enter saturation, the controllable switching means can be respectively controlled such that the second winding 42 is not short-circuited while the source impresses a direct current on the first winding 41.

A test response of the transformer 40 can be automatically evaluated in step 54. The evaluation can comprise determining a winding resistance in the case of a static resistance measurement, determining a stray impedance, determining a stray inductance, determining a transformation ratio or determining a combination of two or more than two of these characteristic variables.

The controllable switching means 15 can be switched once or several times during the test procedure.

Figure 5:
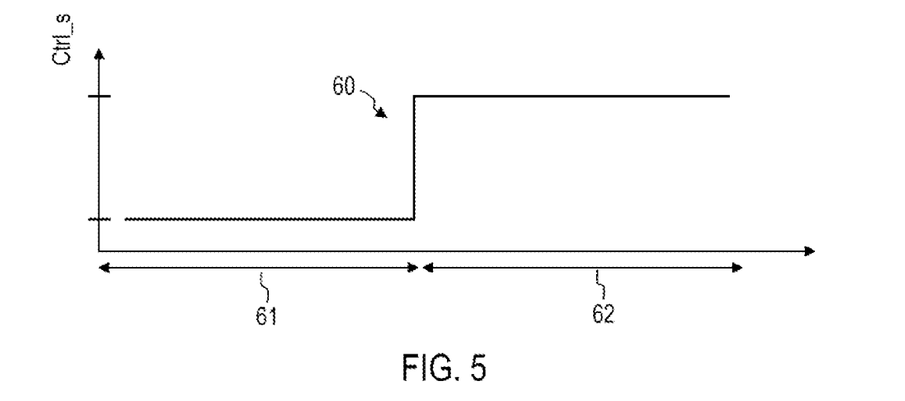
FIG. 5 illustrates a short circuit which is generated in a time-dependent manner by a transformer test device according to one exemplary embodiment.
Figure 6:
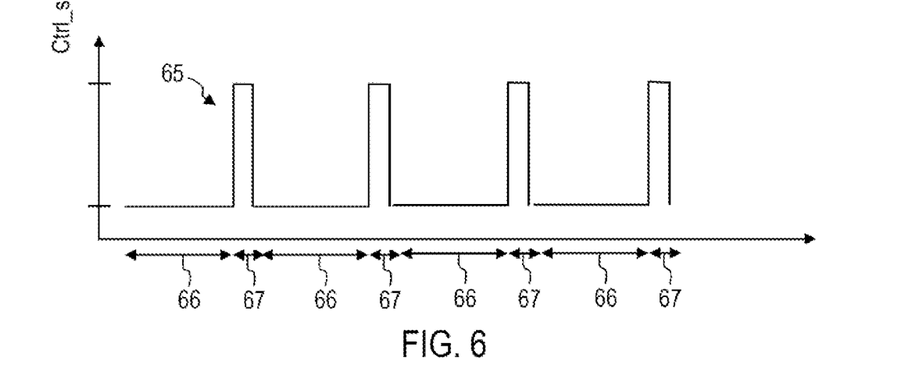
FIG. 6 illustrates a short circuit which is generated in a time-dependent manner by a transformer test device according to one exemplary embodiment.

FIG. 5 and FIG. 6 illustrate, by way of example, a control signal Ctrl_s for controlling the controllable switching means 15 during a test procedure. The control signal can be automatically generated by an integrated semiconductor circuit of the transformer test device 10. The control signal can be automatically generated by an integrated semiconductor circuit of the transformer test device 10 in accordance with a time schedule or depending on an output signal from at least one of the measurement devices 14, 16, 21 of the transformer test device 10.

FIG. 5 illustrates a control signal 60 for actuating the controllable switching means 15 in a test procedure which can be performed by the transformer test device 10. In a portion 61 of the time period of the test procedure, the control signal 60 has a first value and the controllable switching means 15 is open, so that the controllable switching means 15 does not short-circuit the winding 42. At a time during the test procedure, the controllable switching means 15 is switched to the closed state in order to short-circuit the second winding 42. The control signal 60 is changed to a second value for this purpose. In a second portion 62 of the time period of the test procedure, the controllable switching means is closed in order to short-circuit the second winding 42.

The time at which the controllable switching means 15 is closed can be established, for example, by a time schedule or can depend on a condition. For example, saturation of the transformer core can be monitored. The controllable switching means 15 can be closed when the transformer core is completely saturated or when the saturation satisfies a prespecified criterion.

FIG. 6 illustrates a control signal 65 for actuating the controllable switching means 15 in a test procedure which can be performed by the transformer test device 10. The controllable switching means 15 is switched several times to the closed and the open state while the test procedure is being performed. For example, in a portion 66 of the test procedure, the controllable switching means 15 can be respectively open, so that the second winding 42 is not short-circuited. In another portion 67 of the test procedure, the controllable switching means 15 can be respectively closed, so that the second winding 42 is short-circuited.

The time at which the controllable switching means 15 is respectively closed and opened can be established, for example, by a time schedule or can depend on a condition as has been described with reference to FIG. 5.

When the transformer test device 10 is designed in order to short-circuit a plurality of windings of the transformer sequentially in time or simultaneously, the transformer test device 10 can comprise a plurality of controllable switching means. The control signals for the plurality of controllable switching means can be generated in a manner coordinated with respect to time in order to run a test procedure in which a winding or several windings of the transformer are selectively short-circuited, without rewiring having to be performed for this purpose.

Figure 7:
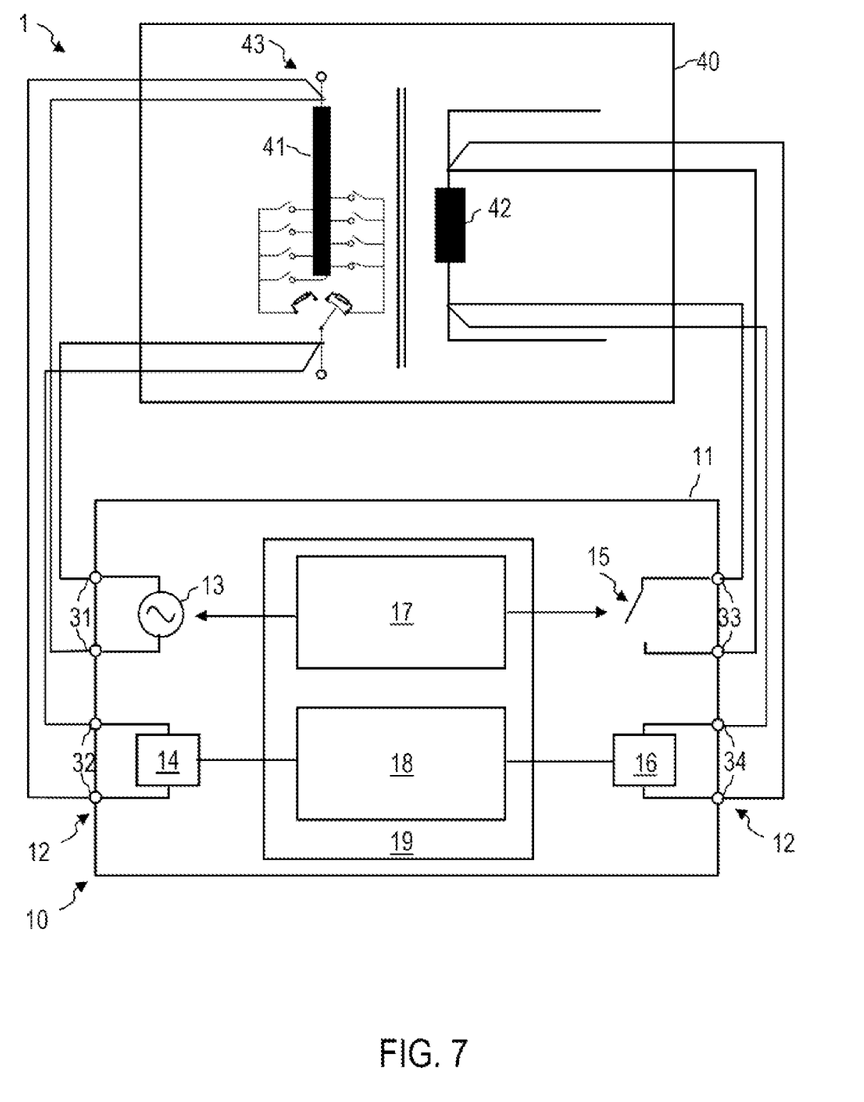
FIG. 7 shows a system comprising a transformer test device according to one exemplary embodiment.

FIG. 7 is an illustration of a system 1 comprising a transformer test device 10 according to one exemplary embodiment. The transformer 40 is designed such that a transformation ratio can be varied. To this end, the transformer 40 can comprise, for example, an on-load tap changer 43 which has a first winding 41. The design and manner of operation of the on-load tap changer 43 are known to a person skilled in the art.

The transformer test device 10 can be designed in order to monitor and evaluate a behavior of the transformer 40 during switching over of the on-load tap changer 43. The transformer test device 10 can be designed, in particular, for dynamic resistance measurement. A winding resistance of the on-load tap changer 43 between the two connections of the on-load tap changer can be ascertained during switchover. To this end, a direct current or alternating current can be impressed by the source 13 and a voltage which is dropped across the on-load tap changer 41 can be recorded using the measurement device 14.

The controllable switching means 15 is designed in order to selectively short-circuit the second winding 42 on the side of the transformer 40 on which an on-load tap changer is not provided. The controllable switching means 15 can be respectively closed when the on-load tap changer 41 is switched over in order to short-circuit the second winding 42. As a result, particularly clear effects can be observed during the switchover process. The controllable switching means 15 can be respectively opened between two processes, so that the second winding 42 is not short-circuited. More rapid stabilization of the behavior of the transformer 40 can be achieved as a result.

A static resistance measurement in which the resistance of the on-load tap changer 41 for one or more frequencies is determined can optionally also be performed for each switching stage of the on-load tap changer 41.

The transformer test device 10 can comprise an interface in order to perform switching of the controllable switching means 15 in a manner coordinated with switchover processes of the on-load tap changer 41. For example, the transformer test device 10 can be designed in order to trigger switchover processes of the on-load tap changer 41. As an alternative or in addition, a beginning of a switchover process can be automatically identified by the transformer test device 10 by monitoring the voltage across the on-load tap changer and can serve as a trigger for automatically switching the controllable switching means 15 to the closed state.

Figure 8:
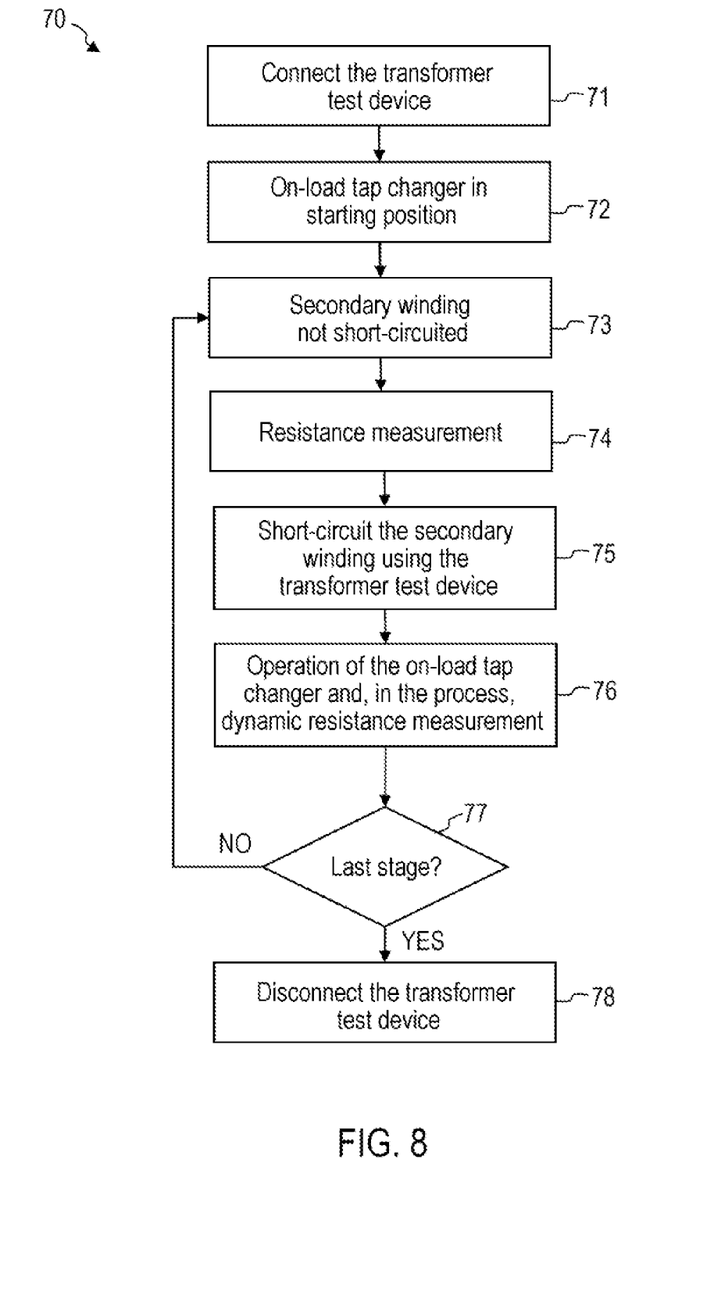
FIG. 8 is a flowchart of a method according to one exemplary embodiment.

FIG. 8 is a flowchart of a method 70 according to one exemplary embodiment. The method 70 can be automatically performed by the transformer test device 10 for the purpose of testing a transformer which comprises an on-load tap changer.

The transformer test device 10 is releasably connected to the transformer 40 in step 71.

The on-load tap changer can be moved to a starting position, which can correspond to a maximum self-inductance of the on-load tap changer for example, in step 72.

The behavior of the transformer 40 can then be automatically recorded during each switchover process of the on-load tap changer 43. A static resistance measurement can optionally be performed for each switching stage of the on-load tap changer 43 in order to ascertain the winding resistance of the on-load tap changer 43. As an alternative or in addition, other measurements can take place between the switchover processes of the on-load tap changer 43.

In step 73, the controllable switching means 15 can be in a state in which the second winding 42 is not short-circuited. As a result, more rapid stabilization of the transformer can be achieved when a direct current is impressed on the primary side.

A resistance measurement can take place in step 74. A winding resistance of the on-load tap changer 43 can be ascertained.

In step 75, the controllable switching means 15 can be actuated such that it is closed in order to short-circuit the second winding 42.

The on-load tap changer 43 can be operated in step 76, so that a switchover process between different switching stages is triggered. The voltage across the on-load tap changer 43 can be measured during the switchover process. In this case, the source 13 can impress, for example, a direct current. A dynamic resistance can be ascertained from the recorded voltage during the switchover process.

In step 77, a check can be made to determine whether the last stage of the on-load tap changer 43 has been reached. The last stage can be, for example, that stage in which the on-load tap changer 43 has the smallest self-inductance. If the last switching stage has not yet been reached, the method can return to step 73. The controllable switching means 15 can be opened in order to not short-circuit the second winding 42.

If the last switching stage is reached, the transformer test device can be disconnected from the transformer in step 78.

The results of the transformer test can be automatically further evaluated and/or archived by the transformer test device.

While exemplary embodiments have been described in detail with reference to the figures, alternative or additional features can be used in further exemplary embodiments. While, for example, the use of a transformer test device in combination with a transformer comprising two windings has been described, the devices and methods according to exemplary embodiments can also be used for transformers with three windings or more than three windings.

While the transformer test device can comprise only a controllable switching means for short-circuiting only one winding of the transformer in exemplary embodiments, the transformer test device can also have two or more than two controllable switching means for short-circuiting a plurality of turns of the transformer. The transformer test device can be designed in order to short-circuit a plurality of windings at the same time or sequentially in time.

While the transformer test device can be designed for the purpose of short-circuiting a low-voltage side of a transformer in exemplary embodiments, the transformer test device can also be designed in order to short-circuit, as an alternative or in addition to the low-voltage side, the high-voltage side or a tertiary winding of the transformer using the controllable switching means.

While a test procedure which involves determining a plurality of characteristic variables of the transformer can be automatically performed in exemplary embodiments, the transformer test device and the method according to exemplary embodiments can also be used if only one characteristic variable of the transformer is measured before a new user input is required.

While the transformer can be installed in a power plant or substation of an energy supply network, the transformer test device and the method according to exemplary embodiments can also be used in smaller transformers.

Transformer test device, methods and systems according to exemplary embodiments allow further automation during transformer testing.

The invention claimed is:

1. A transformer test device for testing a transformer, comprising:
    connections for releasably connecting the transformer test device to the transformer,
    a source for generating a test signal for testing the transformer, and
    a controllable switching device which is connected to the connections during a transformer test for the purpose of short-circuiting at least one winding of the transformer;
    a control device which is connected to the controllable switching device and is configured to automatically actuate the controllable switching device in accordance with a time schedule which depends on a selected test procedure;
    a measurement device for recording a test response of the transformer in reaction to the test signal, the measurement device connected to the at least one winding by connecting lines; and
    an evaluation device connected to the measurement device and is configured for evaluating the recorded test response,
    wherein the control device is further configured to run a transformer test that comprises a first portion of a time period of the transformer test, in which the controllable switching device is actuated such that the at least one winding of the transformer is not short-circuited for determining a first characteristic variable of the transformer, and a second portion of the time period of the transformer test, in which the controllable switching device is actuated such that the at least one winding of the transformer is short-circuited for determining a second characteristic variable of the transformer,
    wherein the measurement device is configured to perform a first measurement during the first portion of the time period, when the controllable switching device is activated such that the at least one winding of the transformer is not short-circuited, to determine the first characteristic variable of the transformer and to perform a second measurement during the second portion of the time period, when the controllable switching device is activated such that the at least one winding of the transformer is short-circuited, to determine the second characteristic variable of the transformer, and
    wherein the first measurement and second measurement are selected from a group including a transformation measurement, a short-circuit impedance measurement, a winding resistance measurement, a stray impedance measurement, and a dynamic resistance measurement, and the first measurement and second measurement are used by the evaluation device to determine operational reliability of the transformer by detecting faults on account of a resistance of the connecting lines based on the first characteristic variable of the transformer and the second characteristic variable of the transformer.

2. The transformer test device as claimed in claim 1, comprising:
    a user interface for selecting the test procedure from amongst a plurality of test procedures.

3. The transformer test device as claimed in claim 1, wherein the control device is designed in order to actuate the controllable switching device and the source in accordance with the time schedule.

4. The transformer test device as claimed in claim 1, comprising:
    a housing in which the source, the controllable switching device and the control device are accommodated,
    wherein the connections are provided on the housing, and
    wherein the controllable switching device is designed for the purpose of conducting a short-circuit current during the transformer test.

5. The transformer test device as claimed in claim 1, wherein the source can be selectively operated as a current source or as a voltage source.

6. A system, comprising:
    a transformer; and
    a transformer test device as claimed in claim 1, which transformer test device is releasably connected to the transformer by means of the connections.

7. A method for testing a transformer comprising a transformer test device which has connections for releasably connecting the transformer test device to the transformer, wherein the method comprises:
    generating a test signal for testing the transformer;
    configuring a controllable switching device which is connected to the connections during a transformer test for the purpose of short-circuiting at least one winding of the transformer;
    configuring a control device which is connected to the controllable switching device and is designed in order to automatically actuate the controllable switching device in accordance with a time schedule which depends on a selected test procedure;

recording, by a measurement device, a test response of the transformer in reaction to the test signal, the measurement device connected to the at least one winding by connecting lines;

evaluating, by an evaluation device, the recorded test response;

determining a first characteristic variable of the transformer during a first portion of a time period of the transformer test in which the controllable switching device is actuated such that the at least one winding of the transformer is not short-circuited for determining the first characteristic variable of the transformer; and determining a second characteristic variable of the transformer during a second portion of the time period of the transformer test in which the controllable switching device is actuated such that the at least one winding of the transformer is short-circuited for determining the second characteristic variable of the transformer, wherein the measurement device is configured to perform a first measurement during the first portion of the time period, when the controllable switching device is activated such that the at least one winding of the transformer is not short-circuited, to determine the first characteristic variable of the transformer and to perform a second measurement during the second portion of the time period, when the controllable switching device is activated such that the at least one winding of the transformer is short-circuited, to determine the second characteristic variable of the transformer, and wherein the first measurement and second measurement are selected from a group including a transformation measurement, a short-circuit impedance measurement, a winding resistance measurement, a stray impedance measurement, and a dynamic resistance measurement, and the first measurement and second measurement are used by the evaluation device to determine operational reliability of the transformer by detecting faults on account of a resistance of the connecting lines based on the first characteristic variable of the transformer and the second characteristic variable of the transformer.

* * * * *